United States Patent [19]

Antikidis et al.

[11] Patent Number: 4,924,222

[45] Date of Patent: May 8, 1990

[54] CAPACITIVE KEYBOARD OPERABLE THROUGH A THICK DIELECTRIC WALL

[76] Inventors: Jean-Pierre Antikidis, 30 Avenue des Sources, 31320 Castanet-Tolosan; Frederic C. Louis, 21 Place Victor Hugo, 31000 Toulouse, both of France

[21] Appl. No.: 788,206

[22] PCT Filed: Feb. 11, 1985

[86] PCT No.: PCT/FR85/00024

§ 371 Date: Oct. 16, 1985

§ 102(e) Date: Oct. 16, 1985

[87] PCT Pub. No.: WO85/03820

PCT Pub. Date: Aug. 29, 1985

[30] Foreign Application Priority Data

Feb. 16, 1984 [FR] France ............... 8402981

[51] Int. Cl.$^5$ ............... H03M 11/00; H03K 17/955
[52] U.S. Cl. ............... 341/33; 341/26; 200/600; 400/479.1
[58] Field of Search ............... 340/365 C, 712, 711; 341/22, 33, 26; 178/17 C; 200/600, 5 A, 5 R, 52 R; 400/477, 479, 479.1

[56] References Cited

U.S. PATENT DOCUMENTS

| | | |
|---|---|---|
| 3,696,409 | 10/1972 | Braaten . |
| 4,257,117 | 3/1981 | Besson ............... 340/365 C |
| 4,263,659 | 4/1981 | Hirata et al. . |
| 4,290,052 | 9/1981 | Eichelberger et al. ......... 340/365 C |
| 4,305,135 | 12/1981 | Dahl et al. . |
| 4,373,124 | 2/1983 | Frame ............... 340/365 C |
| 4,374,381 | 2/1983 | Ng et al. ............... 340/365 C |
| 4,495,651 | 1/1985 | Froeliger . |

FOREIGN PATENT DOCUMENTS

| | | |
|---|---|---|
| 3025841A1 | 2/1982 | Fed. Rep. of Germany . |
| 2271538 | 12/1975 | France . |
| 2090979 | 1/1981 | United Kingdom . |
| 2080536 | 2/1982 | United Kingdom . |
| 2119931A | 11/1983 | United Kingdom . |

*Primary Examiner*—Donald J. Yusko
*Assistant Examiner*—Tyrone Queen
*Attorney, Agent, or Firm*—Robbins & Laramie

[57] ABSTRACT

A keyboard with capacitive keys is operable through a thick dielectric wall which may be integral therewith. The keyboard may be installed inside an agency or store and coupled to a micro-informatic system providing audiovisual information selected at the request of a passer-by on the street operating the keyboard through a thick shop window. The keyboard includes a base panel (1) made of insulating material provided with Cnm electrodes integrated into the panel. with a free running oscillator being associated with each electrode key. A method of scanning the keyboard is provided.

12 Claims, 4 Drawing Sheets

CAPACITIVE KEYBOARD OPERABLE THROUGH A THICK DIELECTRIC WALL

DESCRIPTION

This invention relates to a novel type of capacitive keyboard and the procedure to scrutinize the action of the keys. One will consider this scrutinization as the way to record, versus time, the state of each key on a complete and systematic way. There are many touch-sensitive devices based on capacitive effects either static or utilizing repetitive scrutinization and comparison. The subject of the present invention is related to a judicious combination of electronic and mechanical devices in view of completely solving the specific problem of man-machine interaction when they are separated by a thick dielectric panel like a shop window.

The device consists in a keyboard of standard dimension which can be activated with full reliability through glass thickness up to 30 mm. When keyboards are extensively operated, like in public telephones, or automatic bank terminals, or information terminals, they are often subject to breaks due to improper or too repetitive actions on the keys. Furthermore, whenever one must activate these keyboards with dusty or wet fingers, contamination by water or dust on the associated electronic circuitry is likely to occur. The present invention offers, among other features, the avoidance of these drawbacks by permitting a thick dielectric wall to be interposed in between the keyboard and the operator. The operator can activate a given key by just putting his finger in front of the selected key and possibly obtaining a visual or audio validation signal, enabling him to check his action.

The keyboard, subject of the present invention, utilizes as the activation indicator the dynamic capacitive effect created on an electronic oscillator by the operator's finger which is separated from the key by a thick dielectric wall. The frequency variations of these oscillators is then analyzed.

This keyboard can be, in a few seconds, put on a window and maintained with simple means like double-sided adhesive, and connected at noticeable distance (several meters) to the user of the electronic system with the help of a cable with a very limited number of wires (around five). This number of wires does not change whatever in the number of keys.

Furthermore, the device contains a programmed internal logic which enables it to emulate any traditional keyboard by providing standardized signals (for instance parallel ASCII, RS232C and so on), or more generally create a signal slaved to a particular sequence of action (coded lock). All of these applications can be determined without impact on the hardward but by a proper software selection. Such a type of keyboard is conceived to satisfy usual applications like office data processing, systems to be accessed by a large public, interactive information or advertisement through shop windows, security devices like digital locks for entry doors, safes or cars, keyboards to be utilized with wet or dirty fingers like scales for vegetables, meat, fish, etc.

It is easily understandable that a keyboard which can be operated through a wall constitutes a solution to a growing request in many domains of application when direct contact with the operator is to be avoided for security, reliability or ease of installation reasons, or in the scope of new types of applications like office data processing, information processing, advertisements through shop windows, and industrial equipment. For example, the presently known information and advertisement systems in shop windows always utilizes passive means, because of the presence of a thick window. No interaction can occur in between the street-walker and the inside of the shop. With the help of the present invention, communication can take place through a shop window, enabling an interactive control by the keyboard of any equipment installed inside the shop.

The originality of the present invention versus other known capacitive devices lies in a special scanning technique which leads, in spite of the extremely low capacitive effect as generated by the operator's finger through more than 15 mm. of glass, to absolutely reliable operation.

The present invention deviates fundamentally from so-called "touch sensitive" devices as described in patent GBA 2,080,990 or U.S. Pat. No. 4,145,748, which imply a direct physical contact of the operator's finger with a conductive pad element or very close to it (a few mm. maximum), but constitute an autonomous device to be easily and rapidly installed on any thick dielectric panel (up to several centimeters) separating the user from any system to be activated. The present device can generate output signals absolutely comparable to the one delivered by standard keyboards and consequently does not call for any special utilization constraints.

The basic difficulty to overcome compared with chemical capacitive keyboards lies in the infinitesimal capacitance to be detected every time a finger is approached from a conductive surface through several centimeters of dielectric material. Owing to the finger surface, the capacitance variation is of the order of 0.1 picofarads versus more than 10 picofarads for classical capacitive keyboards (U.S. Pat. No. 4,145,748) or 100 to 300 picofarads in a touch-sensitive system when direct electrical contact occurs in between the operator and a conductive capacitive element (patent GBA 145,748). The effects to be detected are so small (less than one hundred times more feeble), that it was up to impossible to develop a practical device able to be commercialized.

The originality of the utilized electronic device comes from the fact it has been conceived in order to permit a very high sensitivity by selecting appropriate but still simple technical approaches, it is to say:

oscillators being chosen for their high frequency operation associated with a very low tuning capacitance;

time sequential addressing of the oscillators in order to avoid any possible interference;

analysis of frequency variations by straight frequency counting, thereby eliminating all the inaccuracies of amplitude analog detection systems; and evaluation of activation or non-activation of a given key through the help of a programmed software taking into account numerous parameters and not just limited to a subtraction of old versus new measurements (dielectric thickness, individual key sensitivity calibration factors, long-term evolution of frequency variations, etc.).

The invention will be described by a detailed description given as an example of a realization in connection with annexed drawings.

FIG. 1 presents a curve showing the natural frequency variation of the oscillator associated to a given key when the key is activated.

FIG. 2 is a drawing of a possible circuit implementation for a given oscillator.

FIG. 3 describes an example of logic permitting the keys' selection, the frequency counting and acquisition process with the help of a periodical logical signal driving a key address counter and decoder (the latter one generating a reference pulse every time the first key is activated).

FIG. 4 constitutes a timing diagram utilized with respect to the apparatus of the present invention.

FIG. 5 presents a circuit description of a resistance-capacitance (RC) oscillator.

Figure 1:
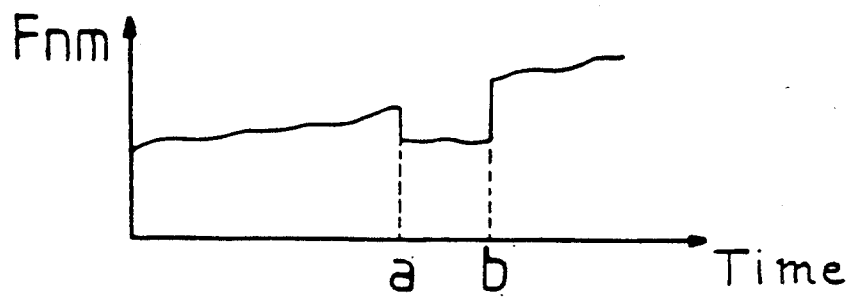
Figure 2:
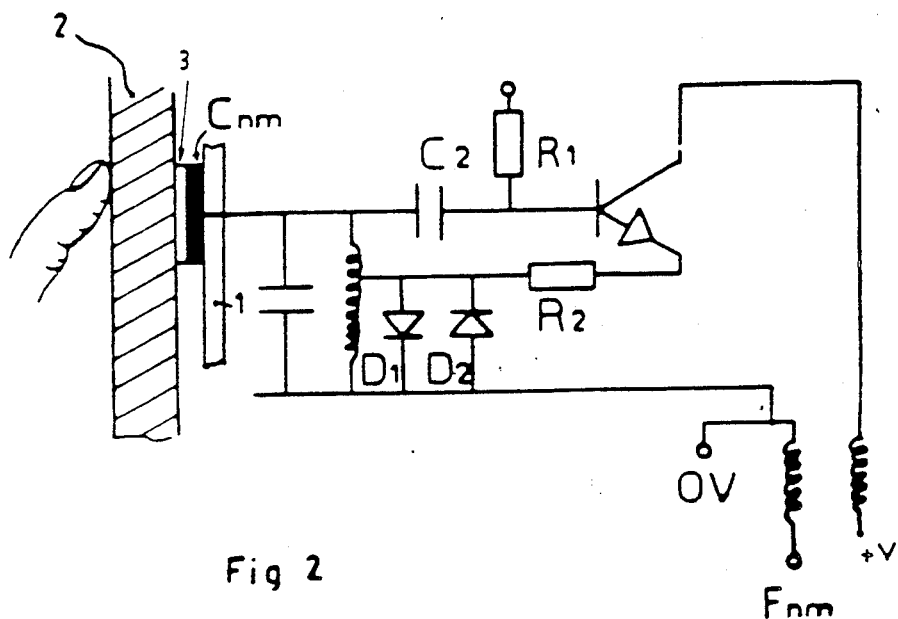
Figure 3:
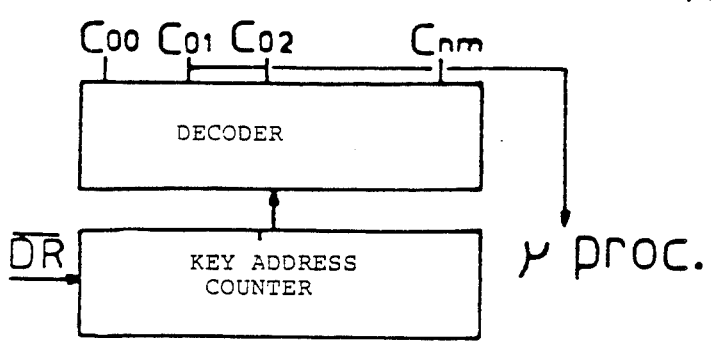
Figure 4:
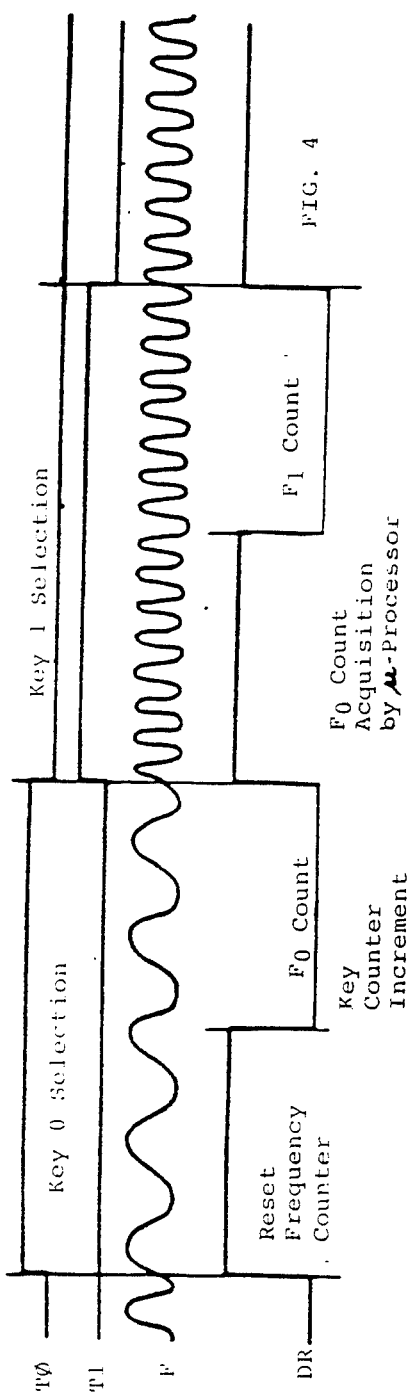
Figure 7:
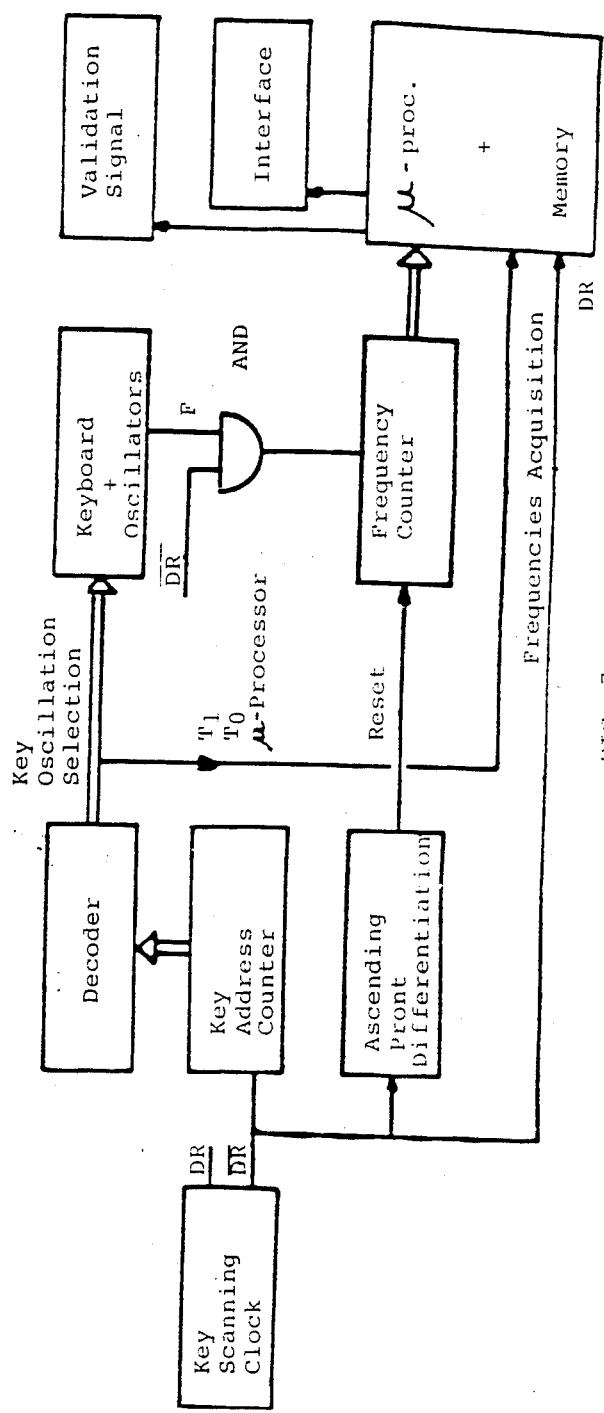
FIG. 7 is a block diagram of one embodiment of the present invention.
Figure 5:
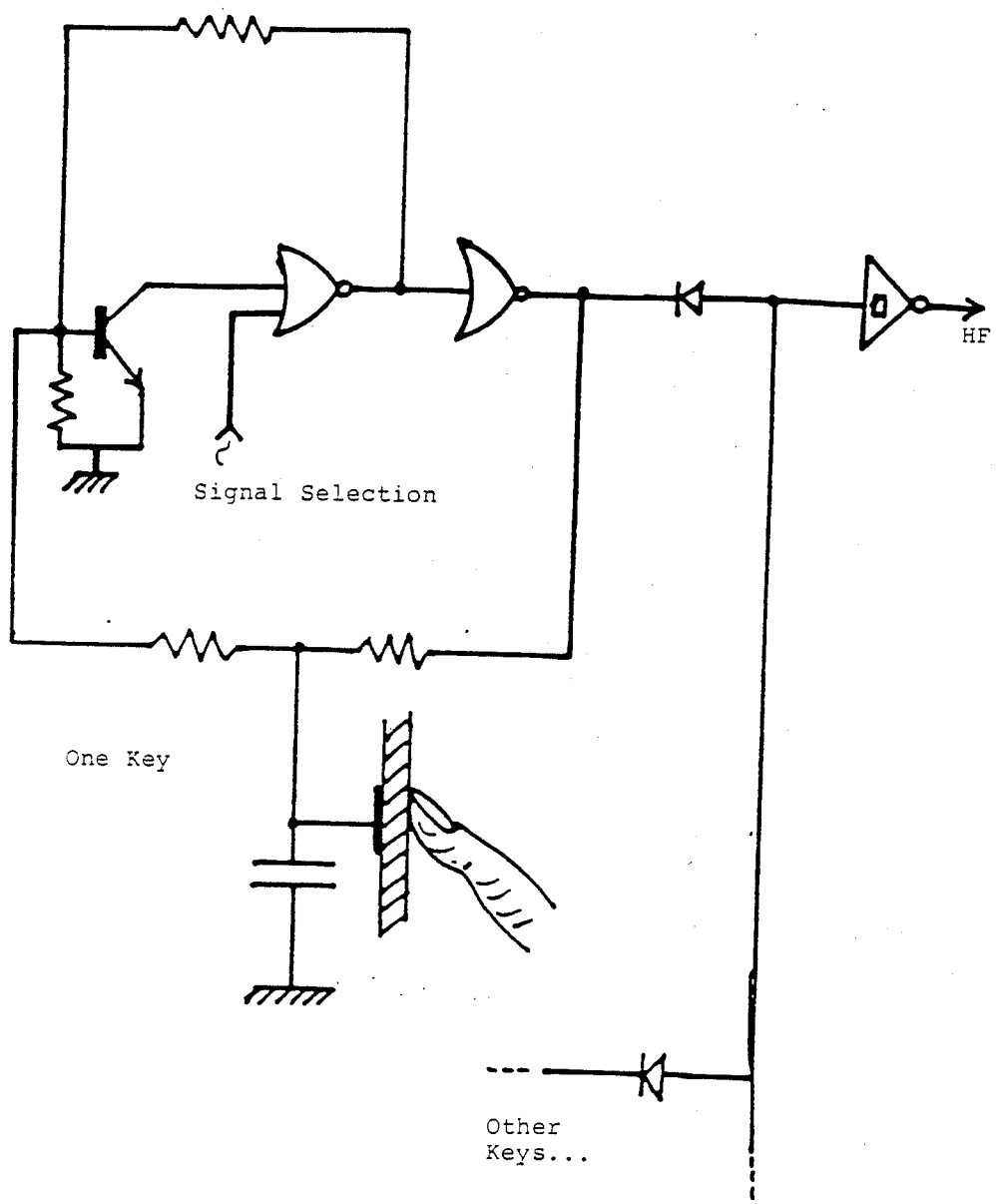

In accordance with the present invention, there are a plurality of conductive surfaces, each one being associated with a free-running high frequency oscillator.

In accordance with the present invention, the conductive surfaces or keys are never touched by the finger operator but the approach of the finger is detected through 1 to 30 mm. of dielectric substance. The extremely small variation of capacitance is reliably detected with the help of a microprocessor-based frequency analysis logic in combination with special interface electronics described hereinbelow.

A possible realization implementing the principles claimed in the invention consists in a mechanical realization with:

A supporting panel (1) made out of insulating material receiving electrodes Cnm and constituting the keys. This supporting panel can either be rigid, soft, or supple.

Should the need arise, a dielectric layer (3), preferably adhesive, can be added in order to support visual key identifiers. It can be put on the supporting panel (1) or on any of the sides of dielectric panel (2).

A dielectric panel (2) which can be joined or not to the supporting panel (1), and in this latter case against which the supporting panel (1) and possibly the dielectric layer (3) are mechanically maintained. This dielectric panel can be transparent or opaque.

The electrodes Cnm (n designating the row and the m the column), made out of conductive material and which may carry their own printed identifiers.

The Cnm electrodes which constitute the keys are each connected to a free-running oscillator. They exhibit a capacitance which varies whenever an electrically grounded surface like an operator finger is put in front of it while being separated by the dielectric panel (2).

The supporting panel (1) can incorporate some or all parts constituting the keyboard or its associated elements like Cnm electrodes, the oscillators, the microprocessor and its associated circuitry. In another mode of realization, the Cnm electrodes can be integrated in the dielectric panel (s) during the fabrication process as well as their associated oscillators and other associated electronic parts (microprocessor and interface); in this case, the supporting panel is not required.

It is understood that this keyboard and its associated means can be implemented in very different fashion, but as long as they are in line with the general principles of the invention they will be considered as belonging to the scope of the present patent.

An electronic circuitry with:

(A) a keyboard interface containing:

The oscillators associated to each key, the natural frequency of oscillation being influenced by the finger proximity. Each of the oscillators is set on one after the other with the help of a logical selection signal as generated by a key counter and its associated decoder. The advantage of such temporal selection with respect to the multiplicity generally utilized is that it prevents any sort of interaction to occur between the key oscillators (such a phenomenon is commonly known as frequency pulling and spurious interference). Furthermore, this working procedure limits the overall power consumption of the system which is the same whatever the number of keys. The key oscillators are designed in such a way that they work at high frequencies with as low as possible tuning capacitance (frequency above one Megahertz, tuning capacitance below five picofarads in order to maximize the frequency deviation versus capacitance change).

The oscillators' outputs are connected together, keeping in mind that the chosen selection process only allows for one frequency to be available at a given time. This output is called HF (high frequency). During each period of a synchronizing signal of fixed period duration called DR (data ready), a given oscillator is selected. The HF signal is forwarded to a counter called a frequency counter which, while the DR signal is high, counts the number of oscillations of the HF signal. As soon as the DR signal is low, the frequency counter is stopped and the counting result is ready to be analyzed by a microprocessor. When the DR signal goes back to high level state, the frequency counter is reset to zero and the key counter incremented by one, thus selecting the next key. This process repeats itself cyclically, keeping in mind that the key counter goes to zero every time its own counting capacity is exceeded (for instance, sixteen keys can be addressed with a four bit counter).

(B) A programmed microprocessor which receives on its input lines:

The DR signal which indicates at low levels that the frequency counter is providing a counted value which is proportional (modulo to the counting capacity of this counter) to the frequency of the selected key oscillator. Every transition of the DR signal indicates to the microprocessor that the next key has been selected.

A T1 signal which is the output of the key decoder corresponding to the selection of key number 1. This allows the microcomputer to initialize its scanning sequence.

The output lines of the frequency counter.

With the help of these signals, the microprocessor knows at any time the selected key and when it can access to the frequency value corresponding to this key.

(C) A kernel software which:

cyclically records the frequencies associated to all keys;

decides in response to the behavior of frequency values over several scannings whether a key has been activated or not. This decision is not only triggered by a deviation over two successive scannings but results from a sophisticated algorithm taking into account the dielectric panel thickness, the individual response sensitivity of the keys due to the components' value dispersions as well as to any other parameter which may appear relevant to the manufacturer.

Figure 6:
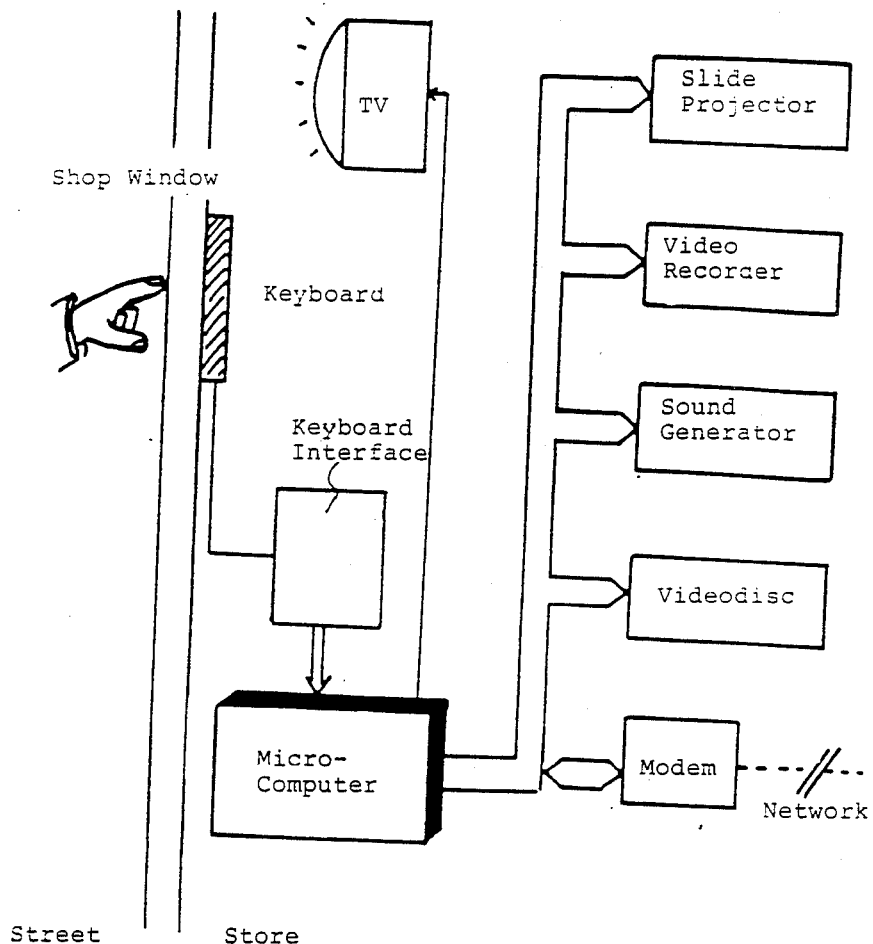
FIG. 6 is a block diagram illustrating the general configuration of the present invention when used in conjunction with a microcomputer and a variety of peripheral devices.

(D) An application software aiming at:

generating logic or analog signals in response to the keyboard operations, like for example, standardized signals as generated by conventional keyboards (parallel ASCII, RS 232, etc.)

generating an output signal in response to a predetermined sequence of action (coded lock, access to restricted areas, etc.)

command whenever necessary external devices reporting or answering to requests made by the operator (FIG. 6), (TV monitor, video recorder, slide projector).

The present invention hereinabove described can be considered as a substantial breakthrough compared with presently known techniques, while offering new areas of application including:

A new technique which allows communication through a thick dielectric wall like a shop window offers now the possibility to permit an interactive dialogue between the street-walker and any automated or computing system safely located inside this shop.

The properties of this keyboard in some of its versions provides a much higher degree of protection against dust, water, moisture and corrosive atmospheres.

This keyboard can be connected to the microprocessor via a cable whose number of wires is usually limited to five and whose length can be up to ten meters without special precaution.

In the majority of its versions the keyboard offers the possibility that it can be easily placed on a dielectric panel by means as simple as that of using tape with adhesive on both sides.

We claim:

1. A keyboard responsive to the proximity of an electrical surface such as the tip of a finger and adapted to be operated through a dielectric protective wall of up to about 30 mm in thickness, comprising:
   a supporting panel adapted to be secured to one side of the protective wall in confronting relationship therewith;
   a plurality of sensing electrodes forming keys of the keyboard, said sensing electrodes being mounted on the supporting panel and facing the one side of the protective wall, each electrode having a relatively low capacitance and being responsive to the proximity of the electrical surface at an opposite, second side of said protective wall;
   a plurality of free running oscillators, at least one of said free running oscillators being connected to the sensing electrodes and having a relatively high variable natural frequency, said natural frequency being dependent upon a capacitance value exhibited by the associated key and varying in response to the proximity of the electrical surface to the key;
   control circuitry means for selectively blocking and unblocking sequentially the free running oscillators such that only one oscillator is activated at a given time; and
   microprocessor means coupled to the control circuitry means for controlling the sequence of oscillator selection and for analyzing the number of counts produced by any oscillator during its activation and deriving therefrom an output indicative of a selected key.

2. The proximity-responsive keyboard of claim 1 wherein the capacitance of each electrode is below about 5 pf.

3. The proximity-responsive keyboard of claim 1 wherein the natural frequency of each oscillator is at least about 1 MHz.

4. The proximity-responsive keyboard of claim 1 wherein the supporting panel is formed of an electrically insulating material and the electrodes are integrally deposited thereon.

5. The proximity-responsive keyboard of claim 4 further comprising a dielectric layer deposited over the supporting panel and the electrodes.

6. The proximity-responsive keyboard of claim 1 further including integral electronic means deposited on the supporting panel including the plurality of free running oscillators, the control circuitry means, and the microprocessor means.

7. The proximity-responsive keyboard of claim 1 further including visual indicia deposited on the supporting panel for identifying each key and adhesive means deposited on the supporting panel for attaching the keyboard to the protective surface.

8. The proximity-responsive keyboard of claim 1 in which the control circuitry means comprises a key address counter having a plurality of outputs, a clock for driving the counter in sequence, and a decoder responsive to the counter outputs for producing a selected output for each oscillator.

9. The proximity-responsive keyboard of claim 1 wherein the protective wall is up to about 30 mm thick.

10. The proximity-responsive keyboard of claim 1 further including clock means operatively coupled to the control circuitry means for generating a logic signal operative to activate the selectively actuated oscillator.

11. The proximity-responsive keyboard of claim 10 wherein the clock means produces a reference signal for the microprocessor means.

12. A method of scanning a keyboard having a plurality of capacitive keys, each key being activated by a change in capacitance thereof in response to the proximity of an electrical surface such as the tip of a finger and being driven by an associated free running oscillator having a variable output depending on the capacitance of the associated key, the method comprising the steps of:
   synchronously generating logic signals for selecting each oscillator in sequence;
   selectively blocking and unblocking each oscillator to produce cyclical output successively in sequence for a predetermined interval in synchronism with the logic signals;
   counting the cycles of the cyclical output of each oscillator during the interval to determine whether the key associated with the oscillator whose cyclical output is being counted has been touched;
   resetting the count to zero after each interval;
   generating a synchronizing reference signal for the selected oscillator;
   comparing the number of counts for a given key of the selected oscillator with preceding counts of the oscillator to determine if the key has been touched;
   determining if the key is activated in accordance with said comparison step; and
   providing a sensible validation signal to permit verification that the key has been activated.

* * * * *